US006607973B1

(12) United States Patent
Jeon

(10) Patent No.: US 6,607,973 B1
(45) Date of Patent: Aug. 19, 2003

(54) PREPARATION OF HIGH-K NITRIDE SILICATE LAYERS BY CYCLIC MOLECULAR LAYER DEPOSITION

(75) Inventor: Joong Jeon, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/244,204

(22) Filed: Sep. 16, 2002

(51) Int. Cl.$^7$ ........................................... H01L 21/3205
(52) U.S. Cl. ..................... 438/591; 438/763; 438/785; 438/786
(58) Field of Search ................. 438/591, 763, 438/785, 786, 623

(56) References Cited

U.S. PATENT DOCUMENTS

| | | | |
|---|---|---|---|
| 6,207,487 B1 | * 3/2001 | Kim et al. | ................... 438/238 |
| 6,348,386 B1 | 2/2002 | Gilmer | |
| 6,420,279 B1 | * 7/2002 | Ono et al. | ................... 438/785 |
| 2001/0024387 A1 | * 9/2001 | Raaijmakers et al. | ........ 365/200 |
| 2001/0041250 A1 | 11/2001 | Werkhoven et al. | |
| 2002/0004279 A1 | 1/2002 | Agarwal et al. | |
| 2002/0106536 A1 | * 8/2002 | Lee et al. | .................... 428/702 |
| 2002/0146916 A1 | * 10/2002 | Irino et al. | ................... 438/785 |
| 2002/0197881 A1 | * 12/2002 | Ramdani et al. | ............ 438/764 |
| 2003/0040196 A1 | * 2/2003 | Lim et al. | ................... 438/785 |
| 2003/0045048 A1 | * 3/2003 | Marsh | ........................ 438/218 |

FOREIGN PATENT DOCUMENTS

EP   1124262   * 8/2001

* cited by examiner

Primary Examiner—Trung Dang
(74) Attorney, Agent, or Firm—Eschweiler & Associates, LLC

(57) ABSTRACT

One aspect of the invention relates to forming a high-k dielectric layer comprising a Group IVB metal compound, especially $HfO_2$, $HfSixOy$ or $HfSixOyNz$. According to the invention, these compounds are formed by molecular layer deposition. According to another aspect of the invention, molecular layer deposition is used to add silicon oxynitride to the dielectric. The silicon oxynitride provides a barrier to diffusion of dopants from the gate to the channel region.

14 Claims, 3 Drawing Sheets

PREPARATION OF HIGH-K NITRIDE SILICATE LAYERS BY CYCLIC MOLECULAR LAYER DEPOSITION

TECHNICAL FIELD OF THE INVENTION

The present invention relates generally to semiconductor devices and more particularly to high-k dielectrics.

BACKGROUND OF THE INVENTION

There is a long felt need for small, portable personal devices. These devices include cellular phones, personal computing equipment, and personal sound systems, which are sought in continuously smaller sizes and with continuously lower power requirements. While smaller and more portable devices are sought, computational power and on-chip memory requirements are increasing. To meet these requirements, small, densely packed semiconductor device features, such as features forming field effect transistors (FETs), are needed.

FETs include a source and drain region separated by a channel. A control gate, typically of polysilicon, is formed over the channel and is electrically separated from the channel by a gate dielectric layer, which is typically silicon dioxide. At a given potential difference, a current will either flow or not flow across the channel between the source and the drain depending on the voltage applied to the control gate.

A limitation on the degree to which FETs can be scaled down relates to the gate dielectric layer. As FETs become progressively smaller, the capacitance between the control gate and the channel must be proportionally increased. To achieve this capacitance, conventional silicon dioxide gate dielectric layers must be very thin: about 5 nm or less for devices with 0.25 $\mu$m features. Issues with gate dielectric layer manufacturing and performance arise at such small thicknesses. Providing a gate oxide layer with sufficient uniformity becomes difficult and leakage current due to quantum mechanical tunneling through the gate layer becomes significant.

In view of these issues, it has been proposed to replace silicon dioxide gate dielectrics with so called high-k dielectrics. A high-k dielectric layer can be made thicker than an electrically equivalent layer of silicon dioxide while providing a given degree of capacitance. High-k dielectrics typically have a dielectric constant of at least about 5, whereby the gate dielectric layer is at least about five times thicker than an electrically equivalent silicon dioxide gate dielectric layer.

Use of high-k dielectrics presents another host of issues. Obtaining a high-k dielectric layer that adheres well to a silicon substrate can be difficult as can controlling the thickness of the high-k dielectric layer. Polysilicon gates are generally doped with boron and many high-k dielectrics are ineffective in preventing diffusion of boron from the gate to the channel region, where the boron can have a variety of undesirable effects. In view of these issues, there is a continuing demand for high-k dielectrics and processes for forming them.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

One aspect of the invention relates to forming a high-k dielectric layer. The high-k dielectric comprises a Group IVB metal compound, especially $HfO_2$, HfSixOy, or HfSixOyNz. According to the invention, these compounds are formed by molecular layer deposition. The Group IVB metal compound can be formed immediately over a silicon channel region.

According to another aspect of the invention, molecular layer deposition is used to add silicon oxynitride to the dielectric layer. The silicon oxynitride provides a barrier to diffusion of dopants from the gate to the channel region. The silicon oxynitride is formed by successively depositing atomic layers of oxygen, silicon, and nitrogen.

Other advantages and novel features of the invention will become apparent from the following detailed description of the invention and the accompanying drawings. The detailed description of the invention and drawings provide exemplary embodiments of the invention. These exemplary embodiments are indicative of but a few of the various ways in which the principles of the invention can be employed.

DETAILED DESCRIPTION OF THE INVENTION

The present invention will now be described with reference to the drawings. The present invention is directed to a method of forming a high-k dielectric film with excellent thickness control thereof. The method comprises forming a a high-k dielectric layer comprising a Group IVB metal compound by molecular layer deposition. Further, molecular layer deposition is employed to add silicon oxynitride to the dielectric layer which provides a barrier to diffusion of dopants from the overlying gate to the underlying channel region. The silicon oxynitride is formed by successively depositing atomic layers of oxygen, silicon, and nitrogen.

Figure 1:
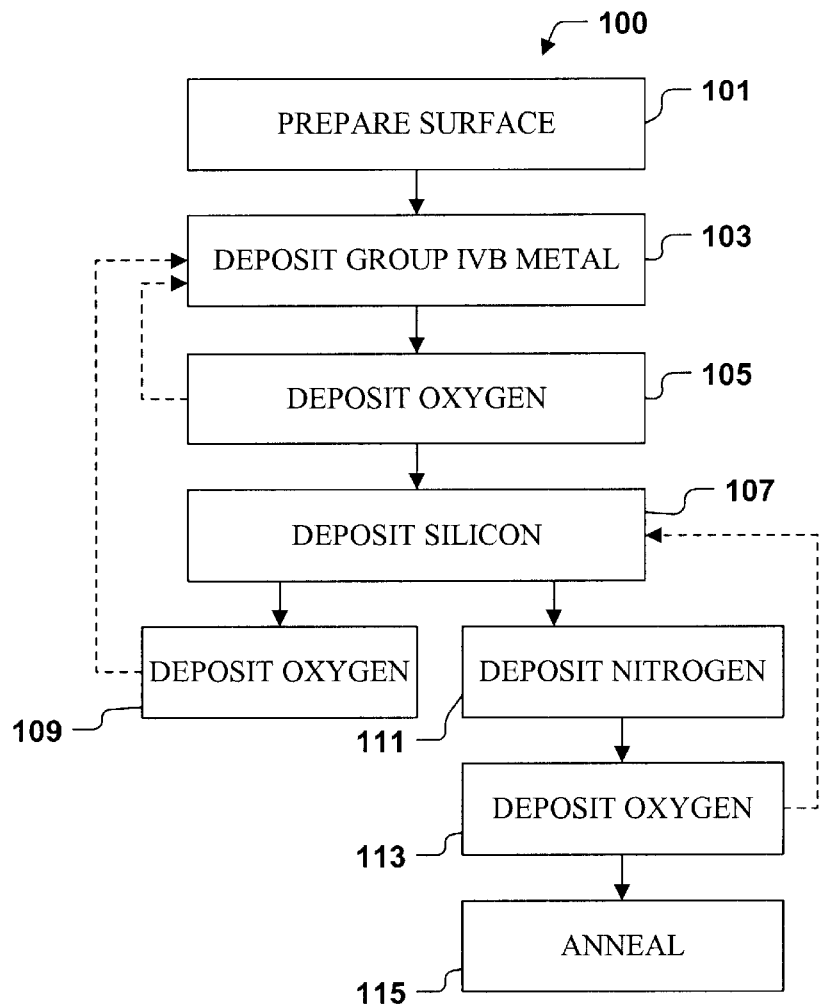
FIG. 1 is a flow chart of a process illustrating several aspects of the present invention.

FIG. 1 is a flow chart of an exemplary process 100 illustrating several aspects of the invention. Although the method 100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

Process 100 comprises substrate surface preparation, Act 101, depositing an atomic layer of a Group IVB metal, Act 103, and depositing an atomic layer of oxygen, Act 105. Acts 103 and 105 can be repeated to form multiple molecular layers of a Group IVB metal oxide. Alternatively, after Act 105, the process can continue with depositing an atomic layer of silicon, Act 107, and depositing another atomic layer of oxygen, Act 109. By repeating Acts 103, 105, 107, and 109, multiple molecular layers of a Group IVB metal silicon oxide can be formed. Depositing an atomic layer of silicon, Act 107, can also be followed by depositing an atomic layer of nitrogen, Act 111, and depositing an atomic layer of oxygen, Act 113. By repeating Acts 107, 111, and 113, multiple molecular layers or silicon oxynitride can be formed over the molecular layers of Group IVB metal compound. Examples of Group IVB metals include Ti, Hf, and Zr, with Hf being preferred. Process 100 also generally includes annealing, Act 115.

Figure 2:
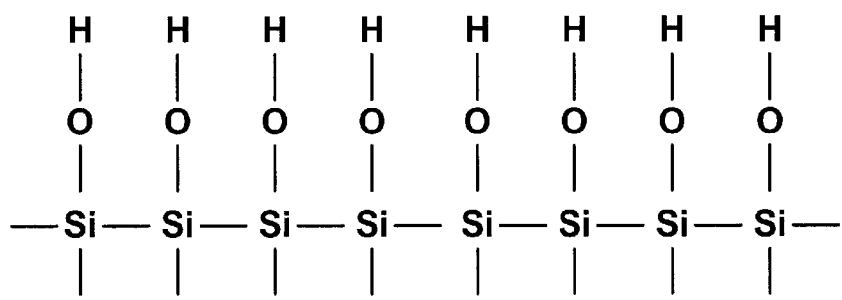
FIG. 2 is a schematic illustration of a semiconductor surface terminated by hydroxyl groups.

Surface preparation, Act 101, in one example is applied before the Group IVB metal oxide is formed directly over a semiconductor substrate, such as silicon. Surface preparation preferably leaves the semiconductor surface terminated by hydroxyl groups, as illustrated in FIG. 2. A hydroxyl group terminated surface can be obtained by exposing a silicon substrate to a clean room atmosphere, for example.

While the substrate generally contains silicon, the substrate can alternatively contain another semiconductors, such as GaAs or InP. In addition to a semiconductor, the substrate may include various elements and/or layers. These can include molecular layers, metal layers, barrier layers, dielectric layers, device structures, active elements and passive elements including source regions, drain regions, bit lines, bases emitters, collectors, conductive lines, conductive vias, etc.

Figure 3:
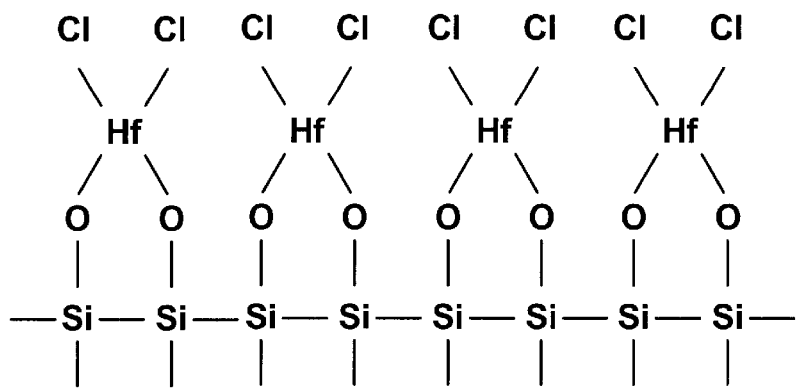
FIG. 3 is a schematic illustration of the substrate of FIG. 2 after depositing an atomic layer of hafnium.

Act 103 comprises depositing an atomic layer of the Group IVB metal on the substrate. This is done by exposing the substrate to a Group IVB metal compound that undergoes a self-limiting reaction with the substrate. For example, $HfCl_4$ will react with hydroxyl groups at the surface to form a layer of Hf as illustrated in FIG. 3. The reaction is self-limiting in that Hf no longer deposits after the accessible surface hydroxyl groups have all been consumed. Exemplary Group IVB metal compounds that can be employed in Act 103 include Group IV metal halides and hydrogen compounds, such as $SrCl_4$, $HfF_4$, $HfCl_3H$, $HfCl_2H_2$, $HfClH_3$, and $HfH_4$.

Act 103 can be referred to as an atomic layer deposition. Atomic layer deposition is depositing a layer of an atom on a substrate by exposing the substrate to a compound that undergoes a self-limiting reaction with the substrate to deposit a monolayer of atoms. Molecular layer deposition is a series of such depositions depositing a monolayer of a molecule. Exposing the substrate to a compound generally involves purging a vessel containing the substrate and then flowing a gas containing the compound over the substrate. The atomic layer depositions of the present invention are generally carried out at reduced pressure (e.g., less than one atmosphere) and in the temperature range from about 100° C. to about 700° C., more preferably in the temperature range from about 150° C. to about 300° C.

Figure 4:
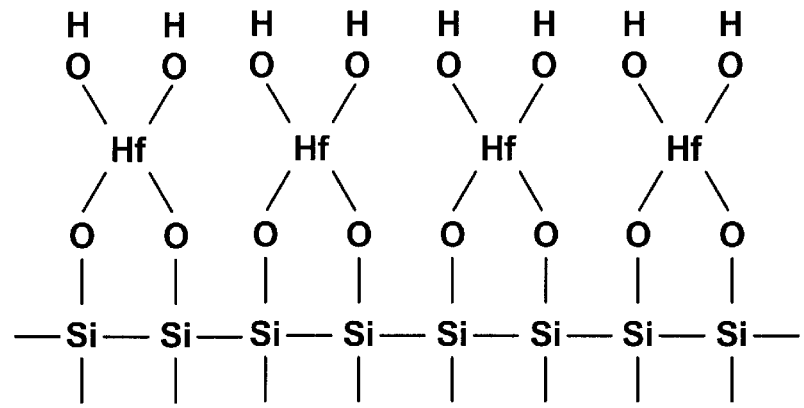
FIG. 4 is a schematic illustration of the substrate of FIG. 3 after depositing an atomic layer of oxygen.

Act 105 comprises depositing an atomic layer of oxygen. This is done by exposing the substrate to an oxygen compound that undergoes a self-limiting reaction with the substrate. Examples of oxygen compounds include hydrogen peroxide, $O_2$, $O_3$, O radicals, NO, and $N_2O$. Preferably, the oxygen compound is water, which leaves the surface terminated by hydroxy groups, as illustrated in FIG. 4, and prepared to receive another layer of the Group IVB metal by repeating Act 103. Acts 103 and 105 can be repeated, as desired, to build multiple molecular layers of a Group IVB metal oxide. Thereby a highly uniform Group IVB metal oxide layer can be built to an accurately controlled thickness.

Figure 5:
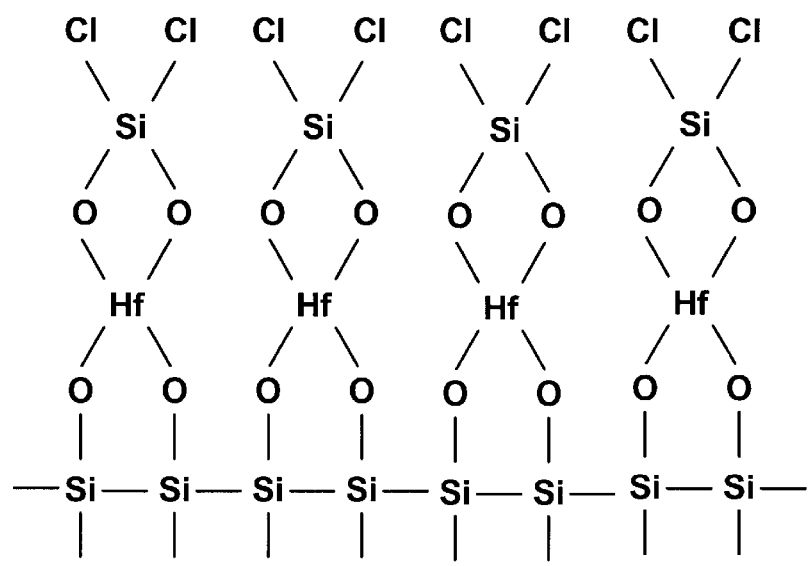
FIG. 5 is a schematic illustration of the substrate of FIG. 4 after depositing an atomic layer of silicon.

Act 105 is alternatively followed by depositing an atomic layer of silicon, Act 107. An atomic layer of silicon is deposited by exposing the substrate to a silicon compound that undergoes self-limiting reactions with the substrate, which is preferably hydoxyl-groups terminated by the preceding act. Examples of silicon compounds include halosilanes and silanes, such as $SiF_4$, $SiCl_3H$, $SiCl_2H_2$, $SiClH_3$, SiH4, alkyl silanes, siloxanes, silanols, and silazanes. Preferably, the silicon compound is $SiCl_4$. A silicon layer thus formed is illustrated schematically by FIG. 5. In the illustration, each silicon atom is bonded to two oxygen atoms, which are in turn bonded to one hafnium atom. The illustration is oversimplified in certain respects. For example, while most silicon atoms are expected to bind two oxygen atoms, the two oxygen atoms need not be bound to the same hafnium atom.

Act 109 comprises generally an oxygen deposition like Act 105. Preferably, Act 109 employs water and leaves the surface again terminated with hydroxyl groups. Repeating Acts 103, 105, 107, and 109 provides multiple uniform molecular layers of a Group IVB metal silicon oxide, preferably HfSixOy (e.g., $HfSiO_4$).

Figure 6:
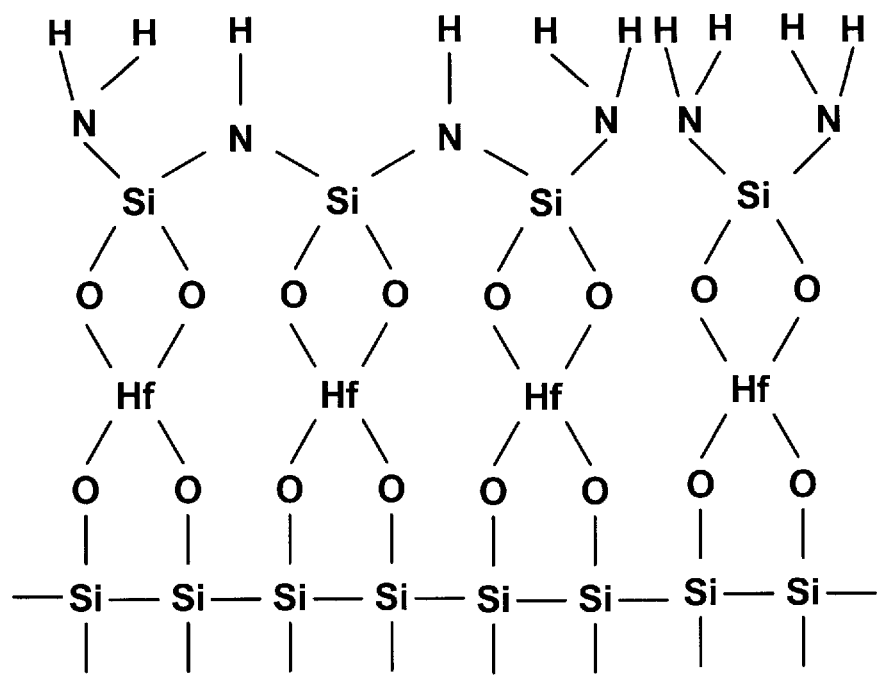
FIG. 6 is a schematic illustration of the substrate of FIG. 5 after depositing an atomic layer of nitrogen.

At some point in process 100, silicon deposition, Act 107, is followed by Act 111, which is depositing an atomic layer of nitrogen. An atomic layer of nitrogen is deposited by exposing the substrate to a nitrogen compound, such as $NH_3$, that undergoes self-limiting reactions with the substrate. Each nitrogen atom can bind to either one or two silicon atoms, as illustrated in FIG. 6.

Figure 7:
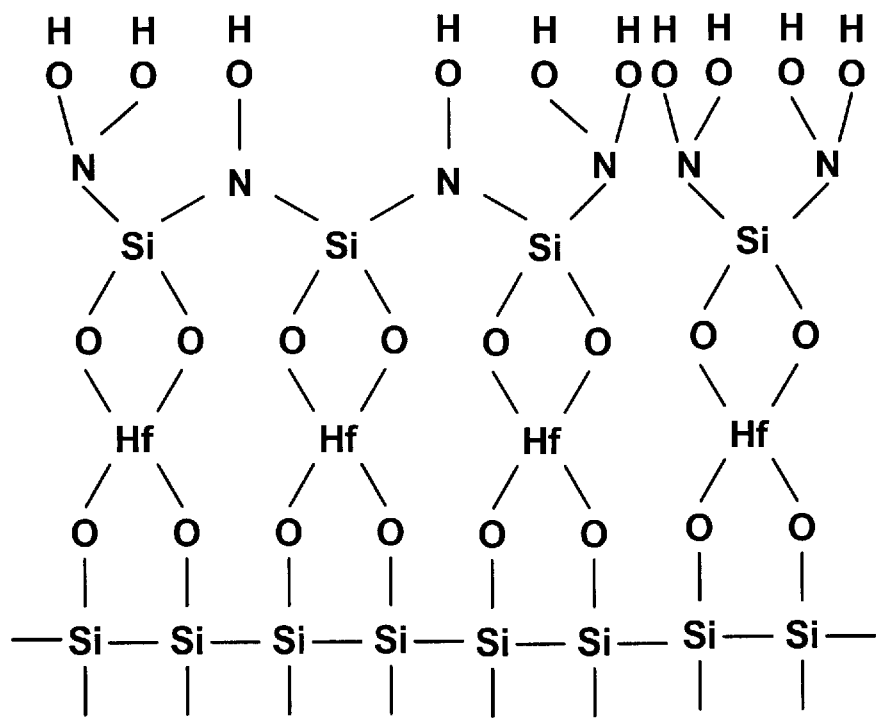
FIG. 7 is a schematic illustration of the substrate of FIG. 6 after depositing another atomic layer of oxygen.

Act 111, nitrogen deposition, is followed by Act 113, depositing an atomic layer of oxygen, as illustrated in FIG. 7. Act 113 generally differs from the oxygen depositions of Acts 105 and 109 in that Act 113 generally provides oxygen to a surface that is saturated with hydrogen. Therefore, while Act 113 also employs an oxygen compound that undergoes a self-limiting reaction with the substrate, a different oxygen compound is generally employed. For example, $O_2$ or $O_3$ can be employed in Act 113.

Repeating Acts 107, 111, and 113 deposits multiple uniform molecular layers of silicon oxynitride. The number of layers can be precisely controlled to provide the fewest number providing a target degree of resistance to dopant diffusion from the subsequently formed overlying doped polysilicon gate.

Act 115 comprises annealing. Annealing is generally carried out rapidly to minimize diffusion of dopants in the substrate. Suitable annealing temperatures are in the range from about 300° C. to about 900° C.

The described processes for forming high-k dielectrics including Group IVB metal oxides, Group IVB metal silicon oxides, and/or Group IVB metal silicon oxynitride dielectrics admit variation in order. For example, silicon oxide, or silicon oxynitride, layers can be deposited before the Group IVB metal layers for interface purposes, for example.

An atomic layer, within the meaning of this description, need not be pure. Preferably, an atomic layer contains at least about 50% of the designated species, more preferably at least about 90%, and still more preferably at least about 99%.

The overall thickness of Group IVB metal compound formed according to the present invention is generally quite small. Preferably, the overall thickness is less than or equal to about 200 Å, more preferably less than or equal to about 100 Å, and still more preferably less than or equal to about 50 Å.

Although the invention has been shown and described with respect to certain embodiments, alterations and modifications providing equivalent structures and acts are likely to occur to those of ordinary skill in the art upon the reading and understanding this specification and the associated drawings. Such alterations and modifications are intended to fall within the scope of the present invention, unless expressly stated to the contrary. Components described in functional terms have structure and involve acts, unless otherwise indicated, corresponding to any of the devices and methods known to those of ordinary skill in the art to perform those functions, even though not equivalent to any of the structures and acts that perform those function in the exemplary embodiments of the invention. In addition, while a particular feature of the invention may have been disclosed with respect to only one of several embodiments, such feature may be combined with one or more other features of the other embodiments as may be desired or advantageous for a given or particular application.

What is claimed is:

1. A process for forming a transistor, comprising:
    providing a semiconductor substrate;
    forming a high-k dielectric layer over the substrate by actions comprising:
        forming an atomic layer of a Group IVB metal by exposing the substrate to a gas comprising a Group IVB metal compound that undergoes a self-limiting reaction with the substrate;
        forming a first atomic layer of oxygen over the atomic layer of the Group IVB metal by exposing the substrate to a gas comprising an oxygen compound that undergoes a self-limiting reaction with the substrate;
        forming a first atomic layer of silicon over an atomic layer of oxygen by exposing the substrate to a gas comprising a silicon compound that undergoes a self-limiting reaction with the substrate;
        forming an atomic layer of nitrogen over the first atomic layer of silicon by exposing the substrate to a gas comprising a nitrogen compound that undergoes a self-limiting reaction with the substrate;
        forming a second atomic layer of oxygen over the atomic layer of nitrogen by exposing the substrate to a gas comprising the same or another oxygen compound that undergoes a self-limiting reaction with the substrate; and
    forming a gate over the high-k dielectric.

2. The process of claim 1, wherein the Group IVB metal is hafnium.

3. The process of claim 2, wherein the high-k dielectric layer comprises a plurality of molecular layers of $HfO_2$.

4. The process of claim 1, further comprising:
    forming a second atomic layer of silicon over an atomic layer of oxygen, the second atomic layer of silicon potentially being formed before the first atomic layer of silicon; and
    forming a third atomic layer of oxygen over the second atomic layer of silicon.

5. The process of claim 4, wherein the Group IVB metal is hafnium.

6. The process of claim 5, wherein the high-k dielectric comprises a plurality of molecular layers of $HfSixOy$ or $HfSixOyNz$.

7. The process of claim 1, wherein the Group IVB metal compound is $HfCl_4$.

8. The process of claim 1, wherein the oxygen compound is $H_2O$.

9. The process of claim 1, wherein the silicon compound is $SiCl_4$.

10. The process of claim 1, wherein the nitrogen compound is $NH_3$.

11. The process of claim 1, wherein the further atomic layer of oxygen is formed by exposing the substrate to a gas comprising $O_2$.

12. The process of claim 1, wherein the atomic layer of the Group IVB metal is formed immediately over a semiconductor portion of the semiconductor substrate.

13. A process for forming a transistor, comprising:
    providing a semiconductor substrate;
    forming a high-k dielectric over the substrate by actions comprising;
        forming an atomic layer of silicon over the substrate by exposing the substrate to a gas comprising a silicon compound that undergoes a self-limiting reaction with the substrate;
        forming an atomic layer of oxygen over the atomic layer of silicon by exposing the substrate to a gas comprising an oxygen compound that undergoes a selflimiting reaction with the substrate;
        forming an atomic layer of a Group IVB metal by exposing the substrate to a gas comprising a Group IVB metal compound that undergoes a self-limiting reaction with the substrate;
        forming a further atomic layer of oxygen over the atomic layer of the Group IVB metal by exposing the substrate to a gas comprising an oxygen compound that undergoes a self-limiting reaction with the substrate;
        forming a second atomic layer of silicon over the further atomic layer of oxygen by exposing the substrate to a gas comprising a silicon compound that undergoes a self-limiting reaction with the substrate;
        forming an atomic layer of nitrogen over the second atomic layer of silicon by exposing the substrate to a gas comprising a nitrogen compound that undergoes a self-limiting reaction with the substrate;
        forming a still further atomic layer of oxygen over the atomic layer of nitrogen by exposing the substrate to a gas comprising the same or another oxygen compound that undergoes a self-limiting reaction with the substrate; and
    forming a gate over the high-k dielectric.

14. The process of claim 13, wherein the Group IVB metal is hafnium.

* * * * *